(12) United States Patent
Chen et al.

(10) Patent No.: US 6,784,053 B2
(45) Date of Patent: Aug. 31, 2004

(54) METHOD FOR PREVENTING BIT LINE TO BIT LINE LEAKAGE IN MEMORY CELL

(75) Inventors: Chia-Hsing Chen, Hsinchu (TW); Chen-Chin Liu, Yunlin (TW); Jiunn-Liang Li, Taichung Hsien (TW)

(73) Assignee: Macronix International Co., Ltd. (TW)

( * ) Notice: Subject to any disclaimer, the term of this patent is extended or adjusted under 35 U.S.C. 154(b) by 0 days.

(21) Appl. No.: 09/906,271

(22) Filed: Jul. 16, 2001

(65) Prior Publication Data

US 2003/0109104 A1 Jun. 12, 2003

(51) Int. Cl.[7] .......................................... H01L 21/8247
(52) U.S. Cl. ....................................................... 438/257
(58) Field of Search ................................ 438/257–267, 438/585, 301, 303, 305

(56) References Cited

U.S. PATENT DOCUMENTS 5,110,753 A * 5/1992 Gill et al. .................... 438/262
5,479,036 A * 12/1995 Hong ........................... 257/315
5,933,732 A *  8/1999 Lin et al. ..................... 438/264
6,121,095 A *  9/2000 Tai et al. ..................... 438/287

OTHER PUBLICATIONS

Wolf et al., "silicon Processing for the VLSI Era vol. 1: Process Technology", Lattice Press, pp. 303–308, 1986.*

* cited by examiner

Primary Examiner—Richard Booth
(74) Attorney, Agent, or Firm—Dickinson Wright PLLC

(57) ABSTRACT

A method for preventing bit line to bit line leakage in a memory cell is described. In this method, P-implantation is applied to suppress the leakage current induced by the damage, wherein the damage is caused by the etching step for the formation of spacers. The P-implantation step is performed after the etching step, and such a sequence centralizes the implanted ions to prevent them from decreasing the threshold voltage. On the other hand, the P-implantation step is performed after the bit line annealing step to prevent the implanted ions from being thermally diffused.

8 Claims, 5 Drawing Sheets

METHOD FOR PREVENTING BIT LINE TO BIT LINE LEAKAGE IN MEMORY CELL

FIELD OF THE INVENTION

The present invention relates to a semiconductor process, and more particularly, to technologies for fabricating an erasable and programmable read-only memory (EPROM), a flash EPROM and a Flash electrically erasable programmable ROM (Flash EEPROM).

BACKGROUND OF THE INVENTION

FIG. 3 is a schematic top view of a conventional memory cell array. In FIG. 3, there are at least word lines 302 and 304 and bit lines 312 and 314. Theoretically, if the word line 302 and the bit line 312 are turned off, and if the word line 304 and the bit line 314 are turned on, only the cell 320 has an "on" state (other cells have "off" states). However, in fact, some cells theoretically having off states may be judged to have on states, since some current (actually leakage current) has been read through them.

In addition to the reading process, leakage current also brings trouble in the programming process. For example, to make a cell 320 have an on state in a programming process, the cell 320 will be biased until a predetermined voltage is achieved. However, in some cases, the cell 320 already has an on state even though the predetermined voltage has not been achieved, because the cell 320 has leakage current through it. Such leakage current causes the device to fail. There is therefore a need of a solution for suppressing the leakage current.

SUMMARY OF THE INVENTION

A purpose of the present invention is to improve the characteristic of a memory cell. Another purpose of the present invention is to prevent a memory cell from having bit line to bit line leakage.

To achieve the above or other purposes, the present invention provides a method for suppressing bit line to bit line leakage in a memory cell. In the method, a plurality of word lines are formed on a silicon substrate. A Tetra-ethyl-ortho-silicate (TEOS) oxide layer is then formed on the word lines. Thereafter, the TEOS oxide layer is etched back, to form spacers on the sidewalls of the word lines, whereby the silicon substrate between the word lines is damaged in this etching back step. After the bit lines are annealed, an ion implantation step is performed to implant boron ions into the silicon substrate between word lines by using the word lines and the spacers as masks, for preventing the damage from inducting leakage current.

Implementing the present invention centralizes the implanted ions, and the centralized ions are not thermally diffused to the channel region to decrease the driving force of the devices. Moreover, the narrow width effect is also reduced.

In another aspect, the present invention provides a process for fabricating a memory cell array. A silicon substrate having a plurality of bit lines is provided. A plurality of word lines are formed on the substrate. On the word lines, an oxide layer is deposited. The oxide layer is etched back to form word lines on their sidewalls. An annealing step is performed. After the annealing step is performed, an ion implantation step is performed to implant ions into the silicon substrate between the word lines by using the word lines and the spacers as masks for suppressing the leakage current between the bit lines (bit line to bit line leakage).

In still another aspect, the present invention provides a method for suppressing the bit line to bit line leakage in a silicon substrate. In this method, after the oxide spacers are formed on the sidewalls of word lines of a memory cell array, an ion implantation step is performed to implant ions into the silicon substrate between the word lines by using the word lines and the oxide spacers as masks, for suppressing the bit line to bit line leakage.

BRIEF DESCRIPTION OF THE DRAWINGS

In FIG. 2, it is shown that the implanted ions are more centralized.

DETAILED DESCRIPTION OF THE PREFERRED EMBODIMENT

Figure 4:
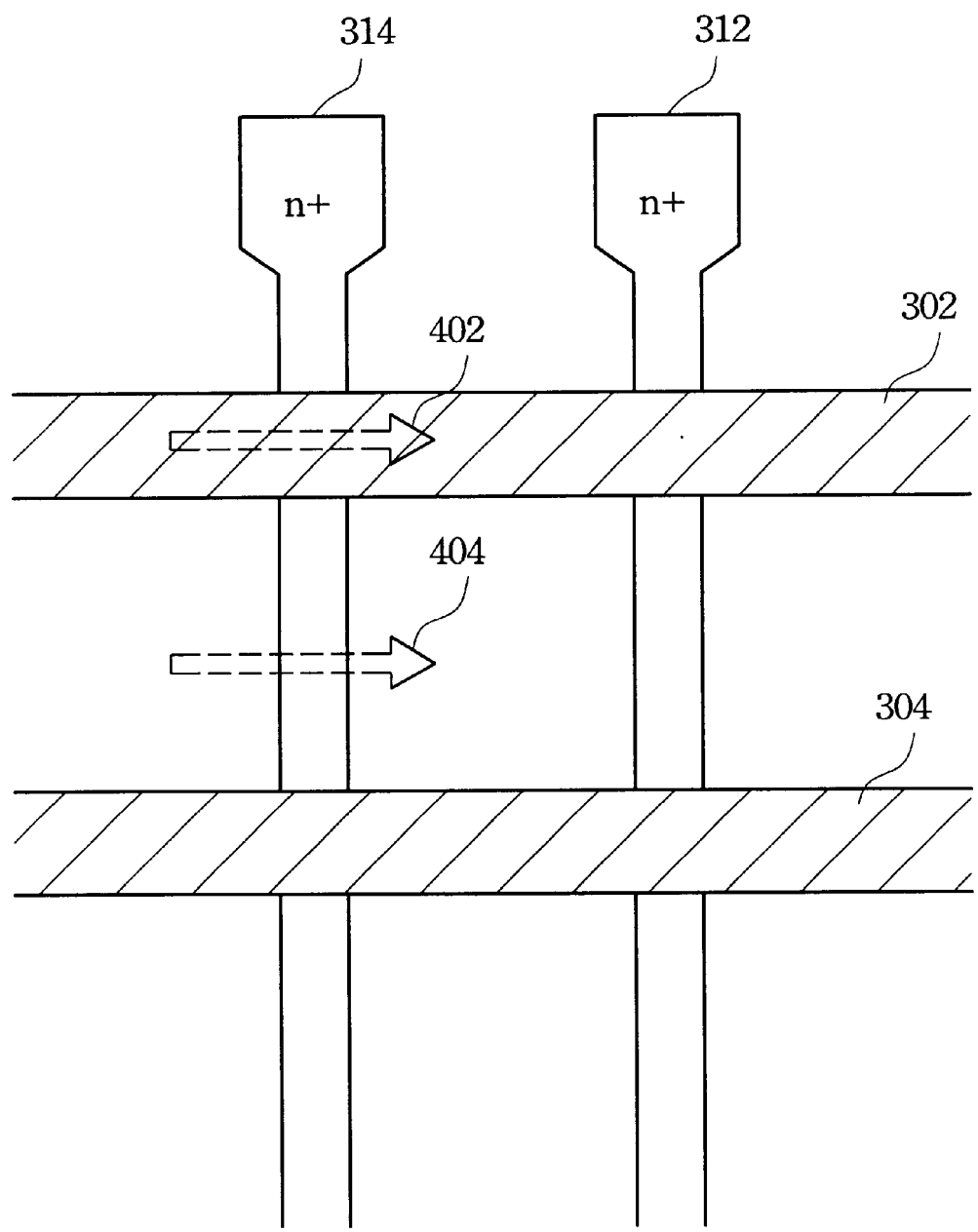
FIG. 4 is a schematic top view of another conventional memory cell array.

The position and the source of the leakage current described in the background should be identified. The position of the leakage current may be the first area 402 (FIG. 4) under the word lines (WL). Another possible position of the leakage current is the second area 404 having no word lines. If the word lines are biased with negative voltage, and if the originally-detected leakage current is therefore turned off, the first area 402 under the word lines is the source of the leakage current. In contrast, if the leakage current still exists after the word lines are biased, the first area 402 is not the source of the leakage current.

On the other hand, if biasing the substrate with negative voltage turns off the leakage current, the second area 404 is the source of the leakage current (called bit line to bit line leakage). In the contrast, if biasing the substrate does not affect the leakage current, the second area 404 is not the source of the leakage current.

Figure 6:
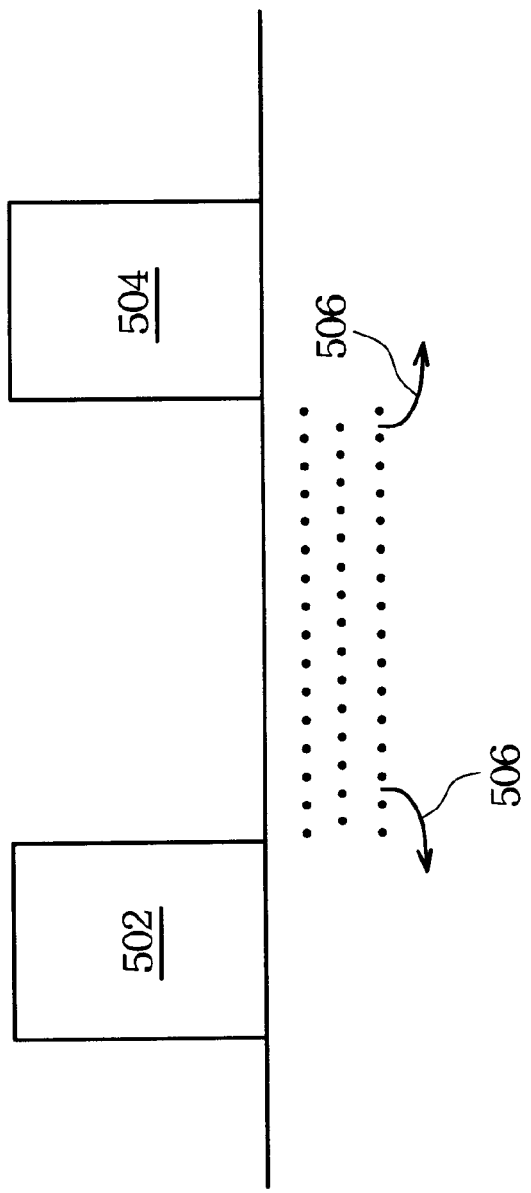
FIG. 6 is a schematic cross-sectional view of a plurality of word lines shown according to a preferred embodiment of the present invention.

After the second area 404 is found to be the source of the leakage current, the reason why the bit line to bit line leakage occurs is further identified. Referring to FIG. 6, a schematic cross-sectional view of a plurality of word lines is shown according to a preferred embodiment of the present invention. Between the word lines 502 and 504, the surface of the silicon substrate 500 is damaged. The damage is a reason why the leakage of current occurs.

Figure 1:
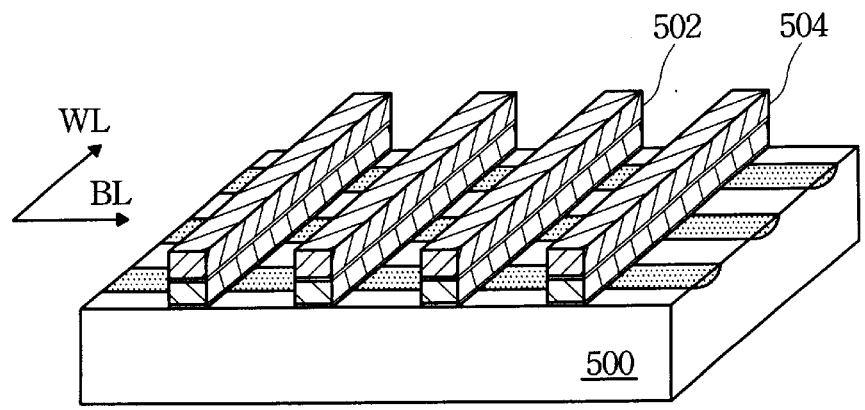
FIG. 1 shows the result of a P-implantation step (the so-called P-implantation is referred to the light doping of P-type ions, such as boron or $BF_2$ ions) performed after a polysilicon etching step and before a spacer forming step in a specified technology.

In one of the prior technologies, to suppress the leakage current, following to a patterning process of the polysilicon word lines, an implantation process is performed to implant boron ions into the substrate 500 between the word lines 502 and 504 (FIG. 1). Such a technology has some drawbacks. For example, the implanted boron ions may thermally diffuse 506 (FIG. 6) to the channel region in the following bit line annealing step. As a result, the thermal diffusion increases the threshold voltage, decreases the driving force of the devices, and therefore induces the narrow width effect.

Figure 2:
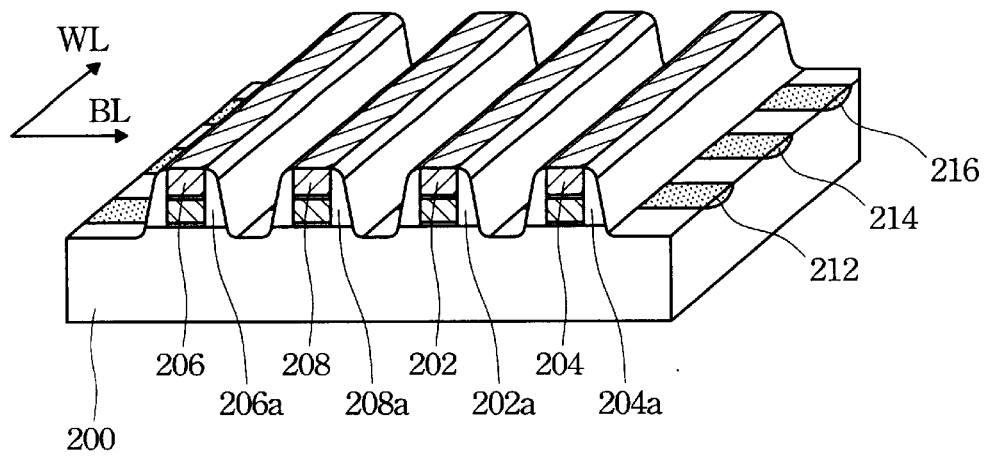
FIG. 2 shows the result of a P-implantation step performed after a spacer forming step according to a preferred embodiment of the present invention.
Figure 3:
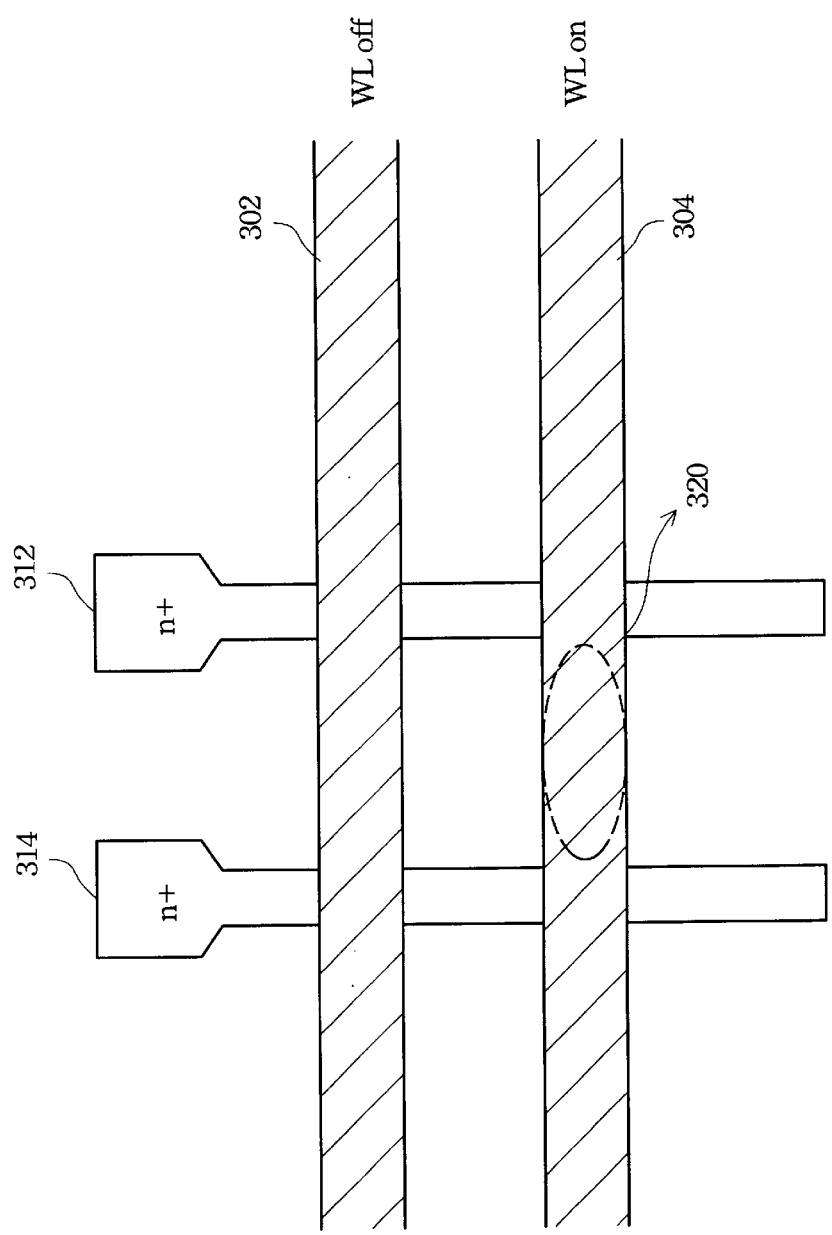
FIG. 3 is a schematic top view of a conventional memory cell array.
Figure 5:
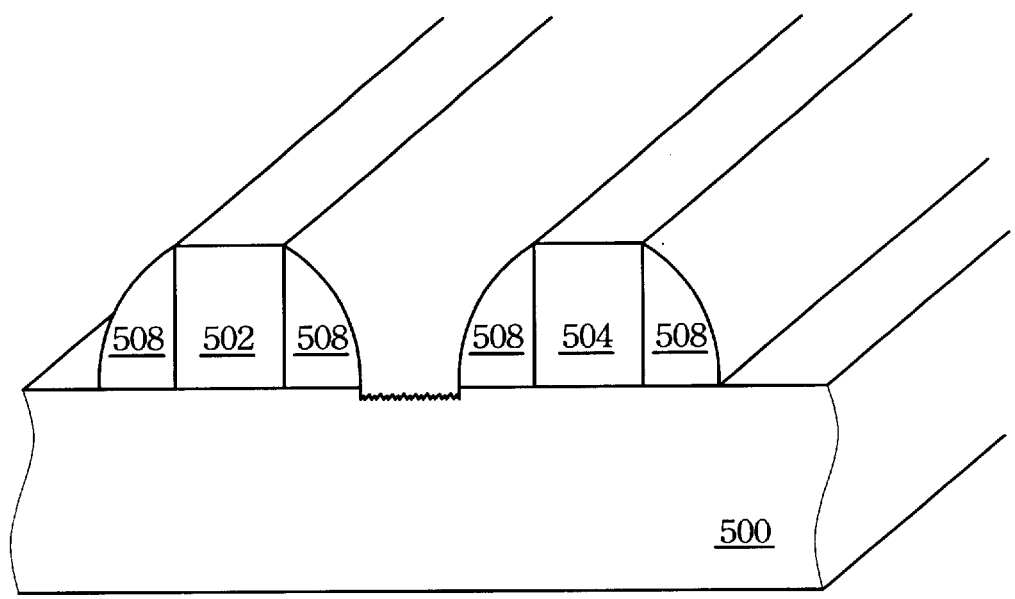
FIG. 5 is a schematic view of a plurality of word lines according to a preferred embodiment of the present invention.

In addition to the identification that the reason the leakage current damages the silicon substrate 500 between the bit lines 502 and 504, it is also discovered that the damage is generated after the etching step for forming spacers 508 (FIG. 5). According to the discovery, the above-described implantation step is changed to be implemented after the etching step. As shown in FIG. 2, there are at least word lines 202, 204, 206, 208 and spacers 202a, 204a, 206a, 208a. More preferably, the implantation step is performed after the bit line annealing step. By doing so, the implanted ions are not thermally diffused.

Performing an implantation step after the etching step for forming spacers not only suppresses the leakage current, but also has the following advantages:

1. A lower threshold voltage is obtained.
2. The implanted ions are more centralized. In other words, they are not easily thermally diffused to the channel region to decrease the driving force of devices.
3. Narrow width effect is reduced.

Process Flow

| Prior Technology | Embodiment of this invention |
| --- | --- |
| polysilicon etch | polysilicon etch |
| P- implantation | Cell re-oxidation |
| Cell re-oxidation | TEOS deposition |
| TEOS deposition | Spacers etch |
| Spacers etch | Pre S/D anneal |
| Pre S/D anneal | P- implantation |
| SiN deposition | SiN deposition |
| BPSG deposition | BPSG deposition |
| BPSG flow | BPSG flow |

To enable one of ordinary skill in the art, a process example of the present invention is described as follows.

PREFERRED EMBODIMENT

Polysilicon Etch

Referring to FIG. 2, a plurality of word lines 202, 204, 206, and 208, made of polysilicon, are formed on a silicon substrate 200. The word lines 202, 204, 206 and 208 are formed by, for example, patterning a polysilicon layer on the silicon substrate 200. The patterning process includes, for example, an etching step.

Cell Re-Oxidation

A re-oxidation step is performed.

TEOS Deposition

A TEOS oxide layer (not fully shown) is deposited on the word lines 202, 204, 206 and 208.

Spacer Etch

The TEOS oxide layer is etched back to form spacers 202a, 204a, 206a and 208a on the sidewalls of the word lines 202, 204, 206 and 208. After the TEOS oxide layer is etched, the silicon substrate 200 between the word lines 202, 204, 206 and 208 are damaged.

Pre S/D Anneal

An annealing step for bit lines 212, 214, 216 (S/D regions) is performed.

P-Implantation

After the annealing step is performed, for example, an ion implantation step is performed, boron ions are implanted into the silicon substrate 200 between the word lines 202, 204, 206, 208, by using the word lines 202, 204, 206, 208 and the spacers 202a, 204a, 206a, 208a as masks, thereby preventing the damage induced by leakage current.

SiN Deposition and Other Following Steps

SiN depositions and the following steps are omitted since they can easily be achieved by those of ordinary skill in the art. (Note that BPSG is borophosphosilicate glass.)

Although the invention has been described in detail herein with reference to its preferred embodiment, it is to be understood that this description is by way of example only, and is not to be interpreted in a limiting sense. It is to be further understood that numerous changes in the details of the embodiments of the invention, and additional embodiments of the invention, will be apparent, and may be made by, persons of ordinary skill in the art having reference to this description. It is considered that such changes and additional embodiments are within the spirit and true scope of the invention as claimed below.

What is claimed is:

1. A method for preventing bit line to bit line leakage in a memory cell, the method comprising:

forming a plurality of word lines having sidewalls on a silicon substrate of a first type, wherein the silicon substrate has formed source/drain region of a second type, and wherein the second type is different from the first type;

depositing a oxide layer on the word lines;

etching back the oxide layer to form spacers on the sidewalls of the word lines, whereby the silicon substrate between the word lines is damaged by the etching back;

performing an annealing step; and implanting ions of the first type into the silicon substrate between the word lines by using the word lines and the spacers as masks after the annealing step.

2. A process for forming a memory cell array, comprising:

providing a silicon substrate of a first type having a plurality of bit lines and source/drain region of a second type thereon, wherein the second type is defferent from the first type;

forming a plurality of word lines having sidewalls on the substrate;

depositing an oxide layer on the word lines;

etching back the oxide layer to form spacers on the sidewalls of the word lines;

performing an annealing step; and implanting ions of the first type into the silicon substrate between the word lines by using the word lines and the spacers as masks after the annealing step.

3. The process according to claim 2, wherein the ions are boron or $BF_2$ ions.

4. The process according to claim 2, wherein the oxide layer is a tetra-ethyl-ortho-silicate oxide layer.

5. The process according to claim 2, wherein the word lines are made of polysilicon.

6. A method for suppressing leakage between bit lines on a P-type silicon substrate, wherein a plurality of word lines having sidewalls are formed over the bit lines, and wherein the word lines have oxide spacers on the sidewalls, the improvement comprising:

implanting P-type ions into the silicon substrate between word lines by using the word lines and the oxide spacers as masks, after an annealing step is performed to anneal the oxide spacer and the bit lines, wherein the implanted boron ions is adapted to suppress the leakage between the bit lines.

7. The method according to claim 6, wherein the oxide spacers are tetra-ethyl-ortho-silicate oxide spacers.

8. The method according to claim 6, wherein the word lines are made of polysilicon.

* * * * *